(12) United States Patent
Fischer et al.

(10) Patent No.: US 7,666,465 B2
(45) Date of Patent: *Feb. 23, 2010

(54) INTRODUCING NANOTUBES IN TRENCHES AND STRUCTURES FORMED THEREBY

(75) Inventors: Paul B. Fischer, Portland, OR (US);
Anne E. Miller, Portland, OR (US);
Kenneth C. Cadien, Portland, OR (US);
Chris E. Barns, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 224 days.

This patent is subject to a terminal disclaimer.

(21) Appl. No.: 11/026,320

(22) Filed: Dec. 29, 2004

(65) Prior Publication Data

US 2006/0141222 A1    Jun. 29, 2006

(51) Int. Cl.
*B05D 1/00* (2006.01)
*B05D 1/04* (2006.01)

(52) U.S. Cl. .................. 427/11; 427/475; 977/720
(58) Field of Classification Search .................. 427/11, 427/475

See application file for complete search history.

(56) References Cited

U.S. PATENT DOCUMENTS

| 6,887,450 B2 * | 5/2005 | Chen et al. ............. 423/445 R |
| 2006/0123628 A1 * | 6/2006 | Horiuchi et al. ............. 29/857 |
| 2006/0138658 A1 * | 6/2006 | Ravi et al. .................. 257/741 |

\* cited by examiner

*Primary Examiner*—Frederick J Parker
(74) *Attorney, Agent, or Firm*—Kathy J. Ortiz

(57) ABSTRACT

Methods of forming a microelectronic structure are described. Embodiments of those methods include providing a substrate comprising at least one opening, and then applying a nanotube slurry comprising at least one nanotube to the substrate, wherein the at least one nanotube is substantially placed within the at least one opening.

16 Claims, 14 Drawing Sheets

INTRODUCING NANOTUBES IN TRENCHES AND STRUCTURES FORMED THEREBY

BACKGROUND OF THE INVENTION

Microelectronic device features continue to shrink to accommodate more transistors and to improve device performance. Shrinking dimensions, however, can result in an increased capacitance and resistance between conductive interconnect lines. Such line resistance and hence RC delay increases may be due to increased surface scattering relative to bulk conduction. In addition electromigration performance may be degraded due to increased current density in smaller conductive lines.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
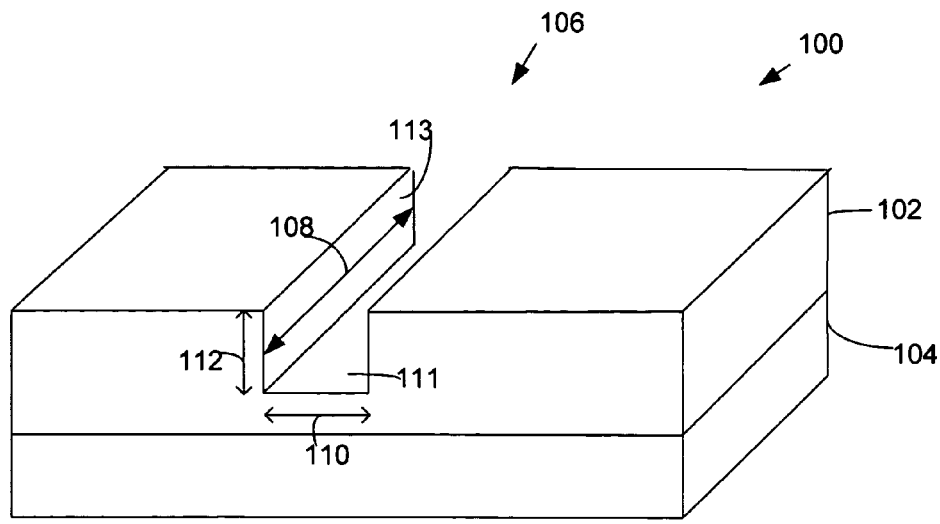
FIGS. 1a-1d represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a nanotube interconnect structure, are described. Those methods may comprise providing a substrate comprising at least one opening and applying a nanotube slurry comprising at least one nanotube to the substrate, wherein the at least one nanotube is substantially placed within the at least one opening.

FIGS. 1a-1d illustrate an embodiment of a method of forming a microelectronic structure, such as a nanotube interconnect structure, for example. FIG. 1a illustrates a substrate 100. In one embodiment, the substrate 100 may comprise a dielectric layer 102 that may comprise an interlayer dielectric (ILD) 102, for example, as is well known in the art. In one embodiment, the dielectric layer 102 may comprise by illustration and not limitation, a silicon dioxide material, for example. In one embodiment, the dielectric layer 102 may comprise a thickness of about 5,000 angstroms to about 3 microns, and may be formed by various deposition methods, such as physical vapor deposition, as are well known in the art. In another embodiment, the dielectric layer 102 may be formed as a layer of a phospho-silicate-glass (PSG), boron doped PSG (BPSG), silicon oxide glass (SOG), silicon dioxide, fluorine-doped silicon oxide, low dielectric constant (low-k) insulator, spin-on dielectric material, or the like. A low-k insulator may be a material having a dielectric constant lower than silicon dioxide.

In one embodiment, the substrate 100 may further comprise a semiconductor layer 104. In one embodiment, the dielectric layer 102 may be disposed on the semiconductor layer 104. In one embodiment, the semiconductor layer 104 may comprise a silicon layer. The substrate 100 may comprise at least one opening 106. The at least one opening 106 may comprise a length 108, a width 110 and a depth 112. In one embodiment, the at least one opening 106 may comprise at least one sidewall 113 and a bottom surface 111. In one embodiment, the at least one opening may comprise a trench, as is well known in the art. In one embodiment, the substrate 100 may comprise a damascene structure, as is well known in the art, wherein interconnect structures may be formed within the at least one opening 106.

Figure 1B:
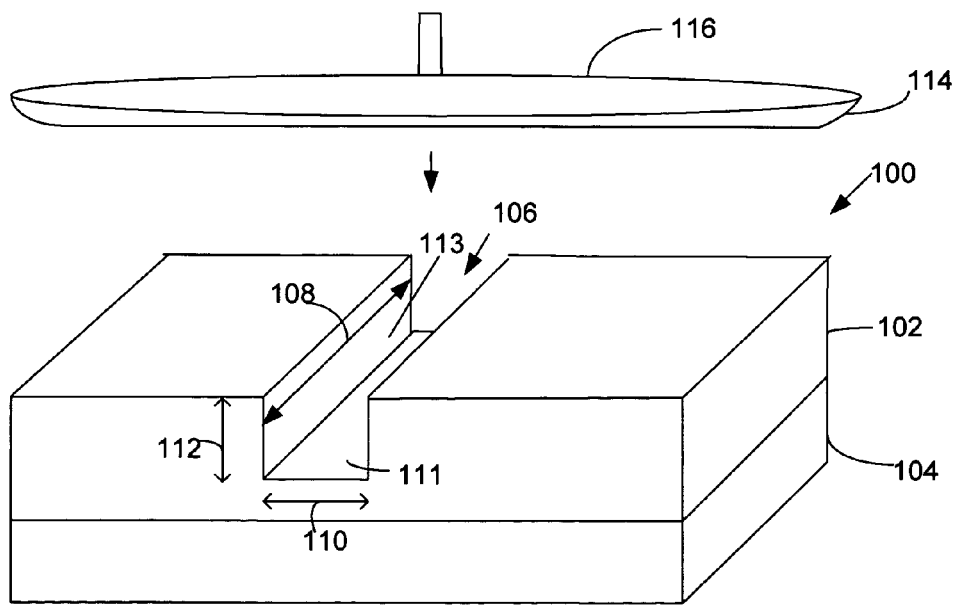
Figure 1C:
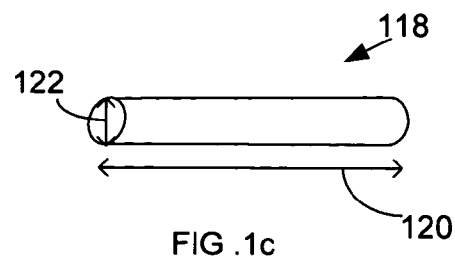

A nanotube slurry 114, as is well known in the art, may be applied to the substrate 100 (FIG. 1b). The nanotube slurry 114 may comprise at least one nanotube 118 (FIG. 1c). In one embodiment, the at least one nanotube 118 may comprise a carbon single walled, and/or carbon multi-walled nanotube. The at least one nanotube 118 may comprise at least one doped nanotube and/or at least one undoped nanotube, and combinations thereof. In one embodiment, the at least one nanotube 118 may comprise any such nanotube that may conduct a high current density, that in one embodiment may comprise a current density equal to or greater than about $10^{13}$ Amperes per centimeter squared. In one embodiment, the nanotube 118 may comprise a low contact resistance.

The at least one nanotube 118 may comprise a length 120 and a diameter 122. In one embodiment, the length 120 of the at least one nanotube 118 may be greater than the width 110 of the at least one opening 106, and the diameter 122 of the at least one nanotube 118 may be less than the depth 112 of the at least one opening 106. In one embodiment, a ratio of the length 120 of the at least one nanotube 118 to the width 110 of the at least one opening 106 may be greater than about 2:1. In another embodiment, a ratio of the depth 112 of the at least one opening 106 to the diameter 122 of the at least one nanotube 118 may be greater than about 2:1. In one embodiment, the length 120 of the at least one nanotube 118 may comprise a length 120 of up to about 1 to about 10 microns, the width 110 of the at least one opening 106 may comprise a width of about 0.20 to about 0.50 microns, and the diameter 122 of the at least one nanotube 118 may comprise a diameter of about 1 to about 25 nanometers.

Referring back to FIG. 1b, in one embodiment, the nanotube slurry 114 may be applied to the substrate 100 by utilizing a mechanical process, such as by utilizing a grinding tool 116, such as in a chemical mechanical process (CMP) as is well known in the art. In one embodiment, the CMP process may comprise a force of about 1 to about 8 psi, a nanotube slurry 114 weight of about 100 to about 500 mL/minute, and a relative linear velocity of about 100 to about 300 feet per minute.

Figure 1D:
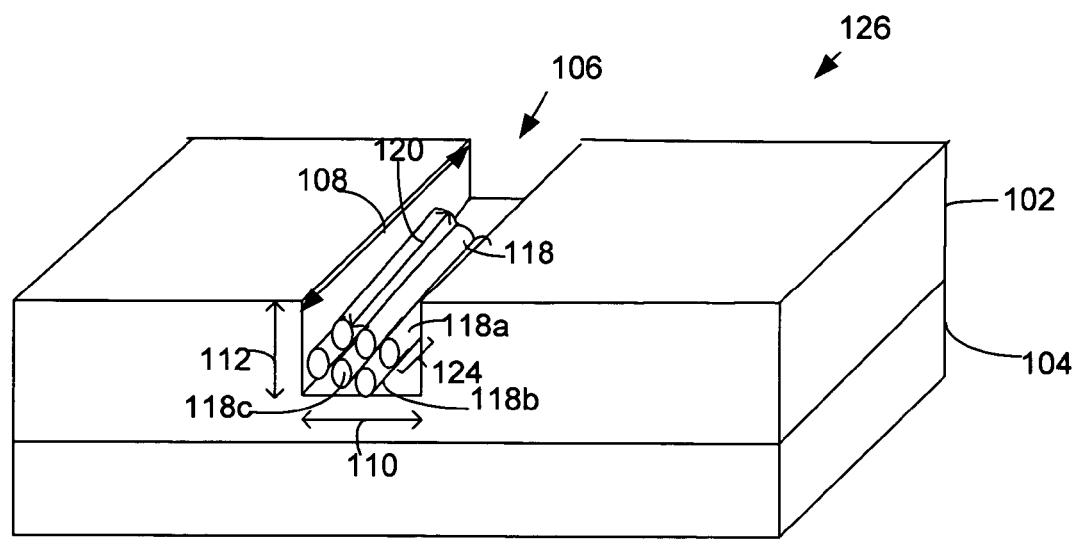

In one embodiment, the force of the mechanical process may be chosen such that the at least one nanotube 118 of the nanotube slurry 114 may be substantially placed, pressed, and/or rolled, into the at least one opening 106 of the substrate 100 (FIG. 1d). The amount of force applied to substantially place the at least one nanotube 118 into the at least one opening 106 will depend upon the particular application. In general, the at least one nanotube 118 of the nanotube slurry 114 may be sufficiently strong to withstand the force of the mechanical process applied during such a process, without damaging and/or breaking the at least one nanotube 118, as is well known in the art. The at least one nanotube 118 may be held and/or bonded within the at least one opening 106 by van der Waal forces, as are well known in the art. For example, in one embodiment, the at least one nanotube 118 may be bonded to the at least one sidewall 113 and/or may be bonded to the bottom surface 111 of the at least one opening 106 by van der Waal forces.

Because the length 120 of the at least one nanotube 118 may be greater than the width 110 of the at least one opening 106, the length 120 of the at least one nanotube 118 may be oriented within the at least one opening 106 in manner that is substantially parallel with the length 108 of the at least one opening 106. In one embodiment, the length 120 of the at least one nanotube 118 may be oriented within the at least one opening 106 within about 20 degrees of being parallel with the length 108 of the at least one opening 106. In addition, because the diameter 122 of the at least one nanotube 118 may be less than the depth 112 of the at least one opening 106, the at least one nanotube 118 may be substantially placed within the at least one opening 106, i.e. the at least one nanotube 118 may be placed such that the at least one nanotube 118 is substantially contained within the at least one opening 106.

In one embodiment, a portion of one of the at least one nanotube 118 may be on and above a portion of a different one of the at least one nanotube 118, i.e. portions of different ones of the at least one nanotube 118 may overlap each other. In another embodiment, the at least one nanotube 118 may also be placed side to side with a different one of the at least one nanotube 118. For example, a portion 124 of a first nanotube 118a may be placed above and on a portion (not shown) of a second nanotube 118b. In another embodiment, the second nanotube 118b may be placed side by side with a third nanotube 118c (i.e. a side portion of the second nanotube 118b may be in contact with a side portion of the third nanotube 118c). It will be understood by those skilled in the art that portions of groups of nanotubes 118 may be placed and/or oriented on and above portions of other groups of nanotubes 118.

Thus, by configuring and optimizing the geometries of the at least one nanotube 118 and the at least one opening 106, a nanotube interconnect structure 126 may be formed. Overlapping portions of the at least one nanotube 118 (i.e. wherein the at least one nanotubes 118 are oriented side by side and/or above and on each other) may greatly reduce the contact resistance, as nanotubes lying side by side may have hopping conduction between adjacent tubes that may greatly reduce the contact resistance of the nanotube interconnect structure 126.

It will be understood by those skilled in the art that in some embodiments, the nanotube interconnect structure 126 may exhibit hopping conduction because of the overlapping orientation of the at least one nanotube 118, as is well known in the art. Additionally, the nanotube interconnect structure 126 may exhibit the characteristic ballistic conduction of the at least one nanotube 118, as is known in the art. In one embodiment, the nanotube interconnect structure 126 may comprise a conduction of about $10^{-13}$ amperes per centimeter squared.

Figure 2A:
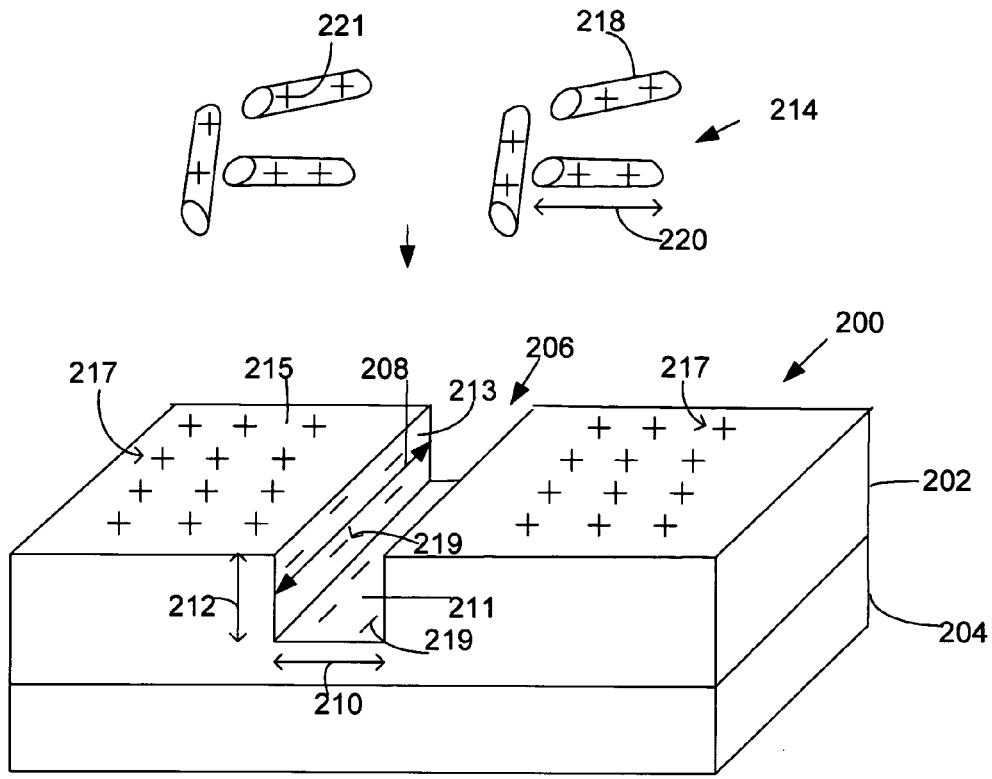
FIGS. 2a-2c represent methods of forming structures according to another embodiment of the present invention.
Figure 2B:
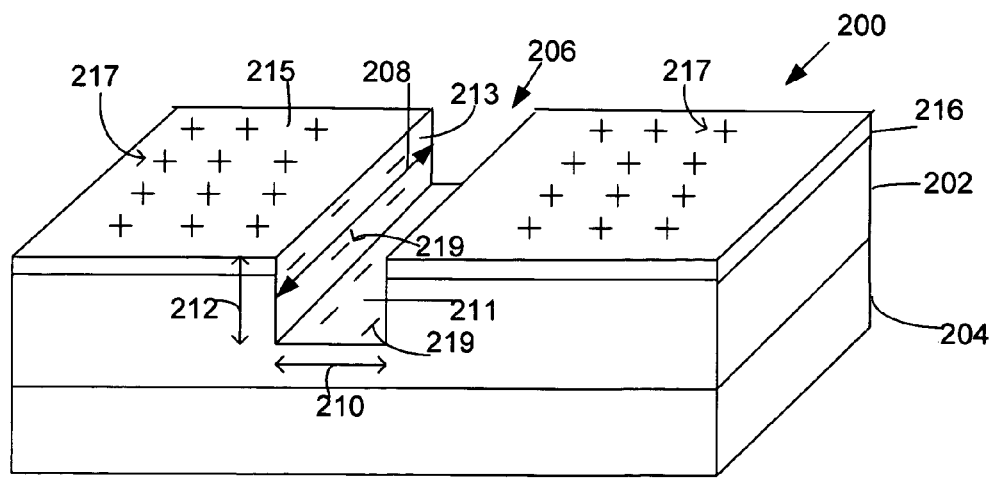

In another embodiment, a substrate 200 may be provided, similar to the substrate 100 of FIG. 1a, for example (see FIG. 2a). In one embodiment, the substrate 200 may comprise a dielectric layer 202 that may comprise an interlayer dielectric (ILD) 202, for example, as is well known in the art. In one embodiment, the dielectric layer 202 may comprise by illustration and not limitation, a silicon dioxide material, for example. In one embodiment, the substrate 200 may further comprise a semiconductor layer 204, wherein the dielectric layer 202 may be disposed on the semiconductor layer 204.

The substrate 200 may comprise at least one opening 206, that may comprise a length 208, a width 210 and a depth 212. In one embodiment, the at least one opening 206 may comprise at least one sidewall 213 and a bottom surface 211. The substrate 200 may further comprise a top surface 215. In one embodiment, the top surface 215 may comprises a first charge state 217. In one embodiment, the substrate 200 may further comprise a charged layer 216, wherein the charged layer 216 may comprise the first charge state 217, i.e. the charged layer 216 may comprise a positive or a negative charge state.

In one embodiment, the charged layer 216 may comprise a hard mask and/or film, for example. In one embodiment, the hard mask and/or film may comprise aluminum oxide, that in the presence of a nanotube slurry with a pH between about 3 and 5 (having a zero point of charge in a pH between about 8 to about 9, as is well known in the art) may have a positively charged surface. The carbon nanotubes (that may have a zero point of charge in a pH of about 6) also may have a positively charged surface. In this embodiment, the hard mask may be any material with a hydroxide having a point of zero charge greater than about 6 such as Ta, TaN, Co, Ni, Cu, or La.

The bottom surface 211 and the at least one sidewall 213 of the at least one opening 206 may be negatively charged in the pH range of the current embodiment, and may comprise various films having a silica-based backbone (with silica have a zero point of charge of about 2.5). Such films may include TEOS, PSG, SiOF, and/or carbon-doped oxides, and combinations thereof. In another embodiment, the charged layer 216 may comprise a film with a silica based backbone and approximately the same pH range of about 3 to about 5. A cationic surfactant such as cetyl trimethyl ammonium bromide, cetyl trimethy ammonium chloride, cetyl trimethyl ammonium hydroxide, dodecyl trimethyl ammonium bromide, dodecyl trimethyl ammonium chloride, dodecyl trimethyl ammonium hydroxide, and others, as are well known in the art, may be used the convert the surface from a negative to a positive zeta potential. Sufficient surfactant may be required to form a double layer as is well know in the art.

In one embodiment, the bottom surface 211 and the at least one sidewall 213 of the at least one opening 206 may comprises a second charge state 219. In one embodiment, the first charge state 217 of the top surface 215 and the second charge state 219 of the bottom surface 211 and the at least one sidewall 213 are of opposite in sign.

For example, in one embodiment, the first charge state 217 of the top surface 215 of the substrate 200 may comprise a positively charged first charge state 217, and the bottom surface 211 and the at least one sidewall 213 of the at least one opening 206 may comprise a negatively charged second charge state 219. Referring back to FIG. 2a, in one embodiment, a nanotube slurry 214 (similar to the nanotube slurry 114 of FIG. 1a) that may comprise at least one nanotube 218 may be applied to the substrate 200, wherein the at least one nanotube 218 may comprises a length 220 and a nanotube charge state 221. In one embodiment, the at least one nanotube 218 may comprise a functional unit (not shown), such as a hydrated carbon site (—COH) that may comprise the nanotube charge state 221, which may comprise a positive or a negative charge.

In one embodiment, the nanotube charge state 221 of the at least one nanotube 218 may be substantially the same as the first charge state 217 of the top surface 215. That is, in one embodiment, the at least one nanotube 218 may be repelled from the top surface 215 because the first charge state 217 of the top surface 215 may comprise substantially the same charge state as the nanotube charge state 221, (for example, they may both comprise a positive charge) since like charges may repel each other.

In one embodiment, the second charge state 219 of the bottom surface 211 and the at least one sidewall 213 may be a negative second charge state 219, and the at least one nanotube 218 (that may comprise a positive nanotube charge state in this example) may be attracted to the bottom surface 211 and the at least one sidewall 213 of the substrate 200, since, opposite charges attract each other. (For example, between a pH of about 3 to about 5, an alumina surface would be positively charged, a silica-based ILD trench would be negatively charged, and an undoped carbon-nanotube would be positively charged).

Figure 2C:
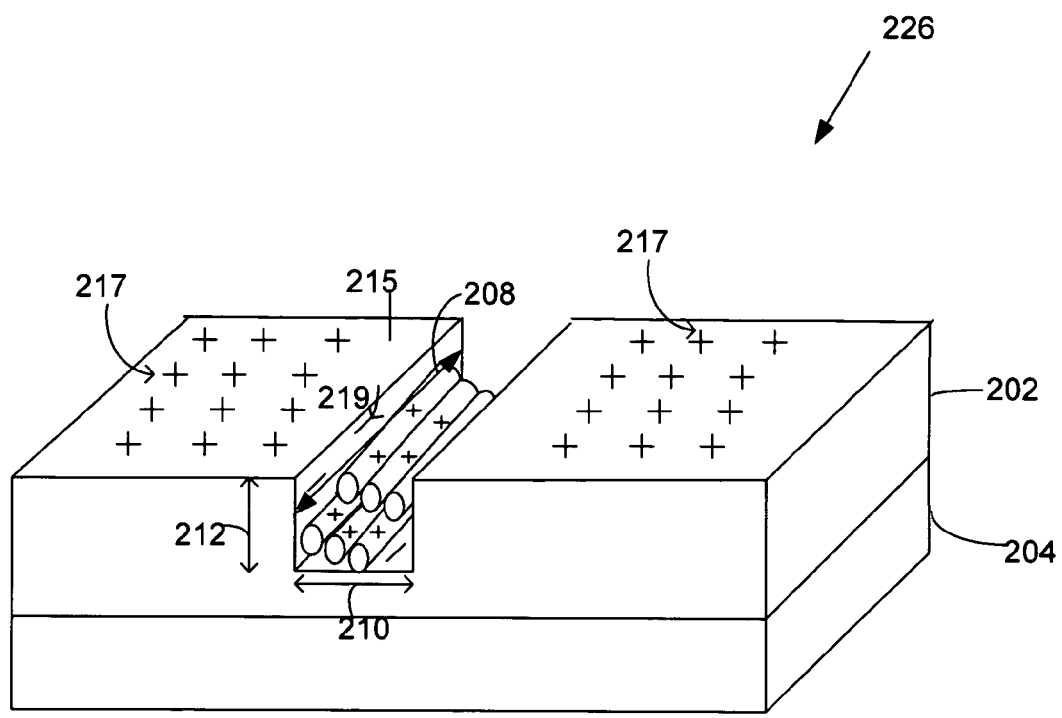

In this manner, the at least one nanotube 218 may be substantially placed within the at least one opening 206 by electrostatic attraction, as is well known in the art (FIG. 2c), to form a nanotube interconnect structure 226. The at least one nanotube 218 may be repelled from the top surface 215 while being attracted to the at least one opening 206. It will be understood by those skilled in the art that the various charge states of the top surface 215, the at least one sidewall 213, the bottom surface 211 of the substrate 200 and the nanotube charge state 221 may be changed by varying the pH of a fluid environment in which the substrate 200 may be placed (i.e., the Zeta potential of the various surfaces may be controlled by controlling the pH of the environment, as is well known in the art).

In this way, the charge states of the top surface 215, the at least one sidewall 213, the bottom surface 211 and the nanotube charge state 221 may be chosen such that the at least one nanotube 218 may be attracted towards the at least one opening 206 while being repelled from the top surface 215. Additionally, because the at least one nanotube 218 may comprise a length 220 that may be longer than the width 210 of the at least one opening 206, the at least one nanotube 218 may be oriented substantially parallel with the length 208 of the at least one opening 206.

Thus, by configuring and optimizing the geometries of the at least one nanotube 218 and the at least one opening 206, a nanotube interconnect structure 226 may be formed. Overlapping portions of the at least one nanotube 218 (i.e. wherein the at least one nanotubes 218 are oriented side by side and/or above and on each other) may greatly reduce the contact resistance of the nanotube interconnect structure 226.

Figure 3A:
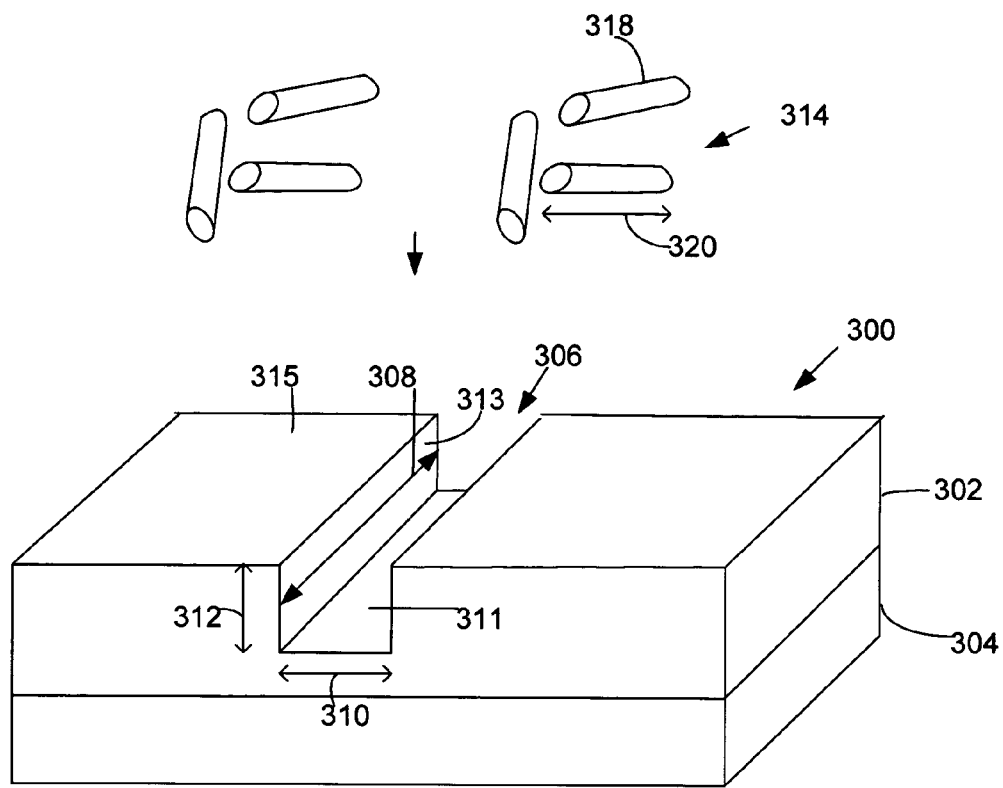
FIG. 3a-3c represent methods of forming structures according to an embodiment of the present invention.

In another embodiment, a substrate 300 may be provided, similar to the substrate 100 of FIG. 1a, for example (FIG. 3a). In one embodiment, the substrate 300 may comprise a dielectric layer 302 that may comprise an interlayer dielectric (ILD) 302, for example. In one embodiment, the substrate 300 may further comprise a semiconductor layer 304, wherein the dielectric layer 302 may be disposed on the semiconductor layer 304.

Figure 3B:
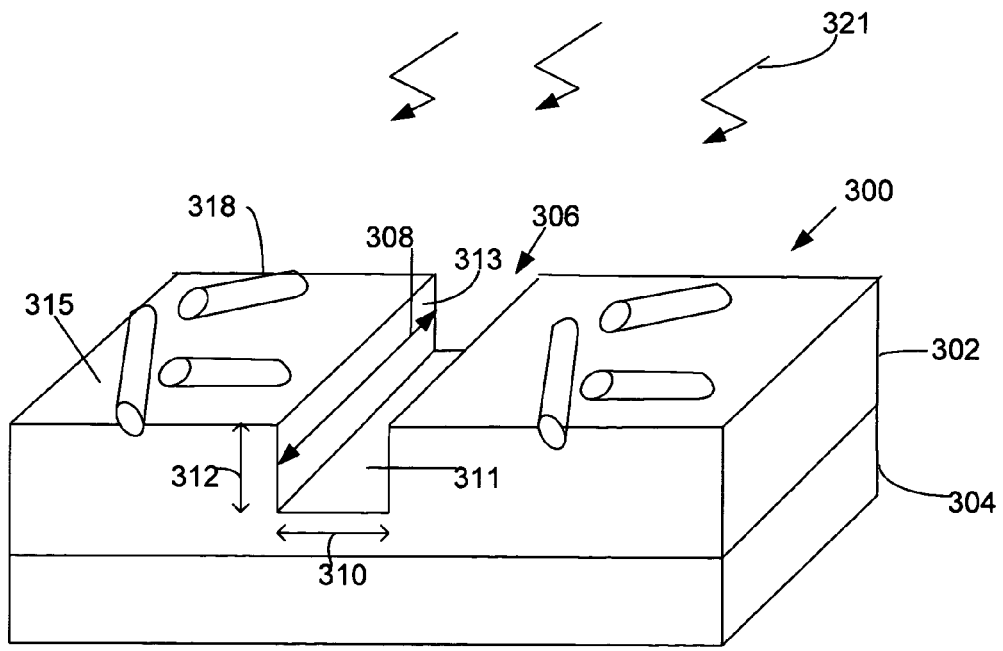
Figure 3C:
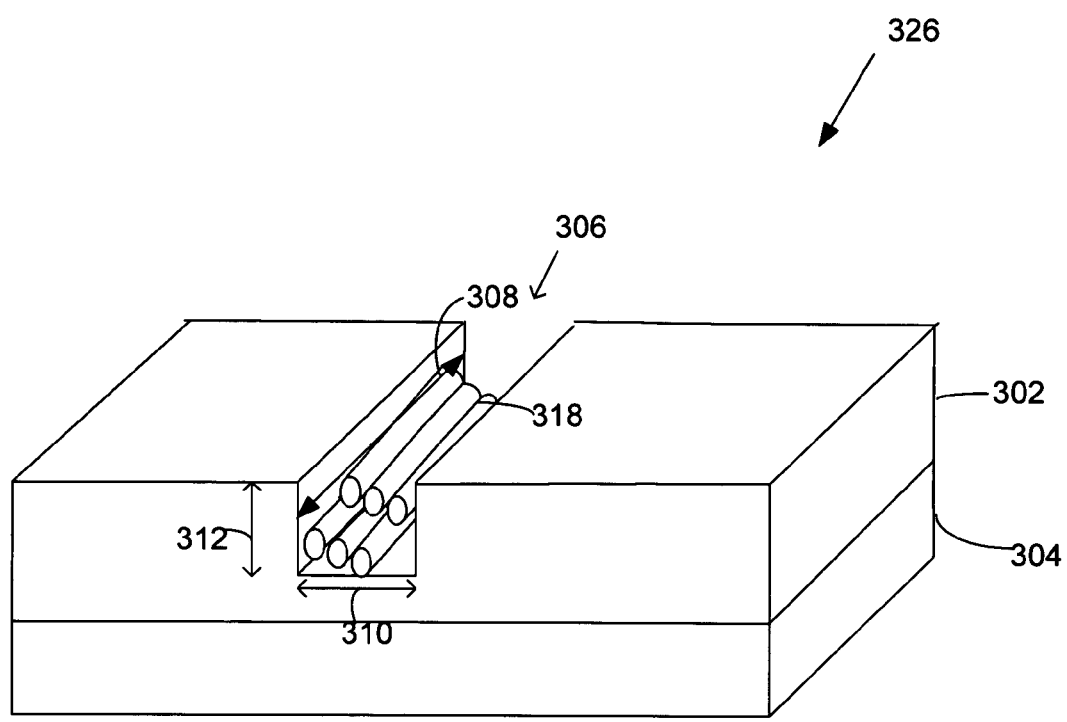

The substrate 300 may comprise at least one opening 306, that may comprise a length 308, a width 310 and a depth 312. In one embodiment, the at least one opening 306 may comprise at least one sidewall 313, a bottom surface 311 and a top surface 315. A nanotube slurry 314 may be applied to the substrate 300, wherein the nanotube slurry 314 may comprise at least one nanotube 318. A vibrational energy 321 may be applied to the substrate 300 (FIG. 3b). The vibrational energy 321 may comprise an ultrasound energy, in one embodiment, but may comprise in general any energy level sufficient to move and/or vibrate the at least one nanotube 318 from the top surface 315 of the substrate 300 substantially into the at least one opening 306. In this manner, the at least one nanotube 318 may be substantially placed within the at least one opening 306 by applying a vibrational energy 321 to the substrate 300 (FIG. 3c).

Because the at least one nanotube 318 may comprise a length 320 that may be longer than the width 310 of the at least one opening 306, the at least one nanotube 318 may be oriented substantially parallel with the length 308 of the at least one opening 306. In one embodiment, portions of different ones of the at least one nanotube 318 may overlap each other. In another embodiment, the at least one nanotube 318 may also be placed side to side with a different one of the at least one nanotube 318.

Thus, by configuring and optimizing the geometries of the at least one nanotube 318 and the at least one opening 306, a nanotube interconnect structure 326 may be formed. Overlapping portions of the at least one nanotube 318 may greatly reduce the contact resistance of the nanotube interconnect structure 326. Additionally, nanotubes that may be residually remaining on the top surface 315 may be removed utilizing methods well known to those skilled in the art.

Figure 4A:
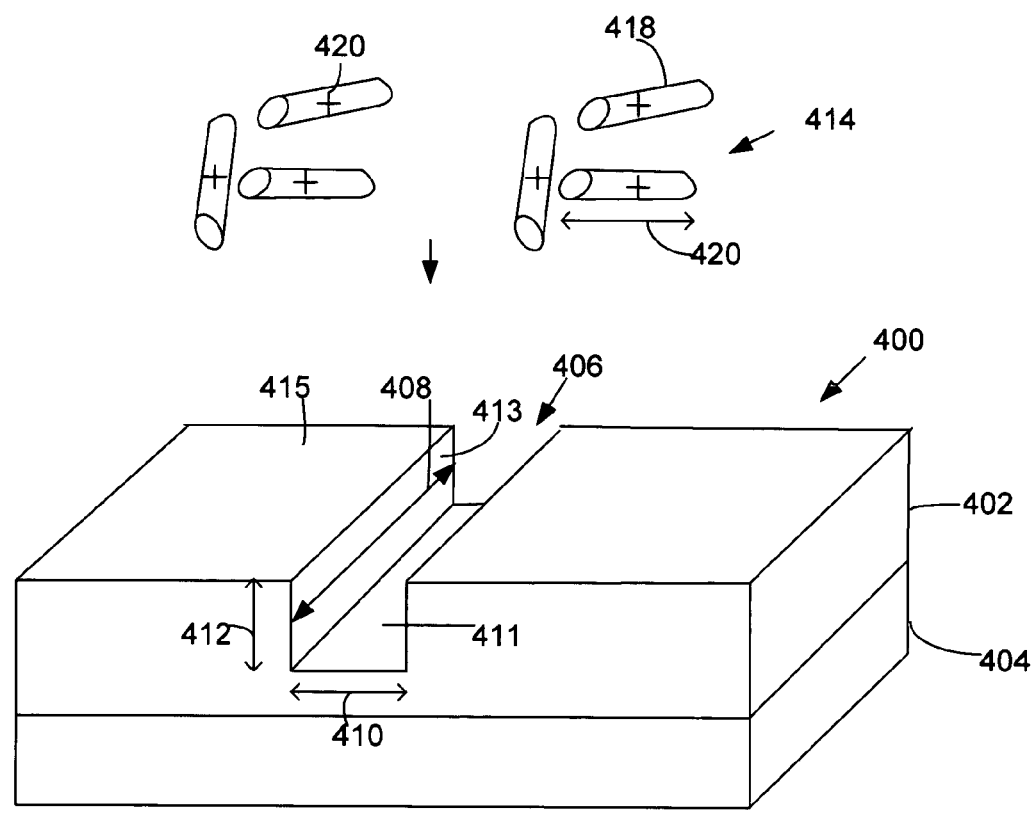
FIG. 4a-4b represent methods of forming structures according to an embodiment of the present invention.

In another embodiment, a substrate 400 may be provided, similar to the substrate 100 of FIG. 1a, for example (FIG. 4a). In one embodiment, the substrate 400 may comprise a dielectric layer 402 that may comprise an interlayer dielectric (ILD) 402, for example. In one embodiment, the substrate 400 may further comprise a semiconductor layer 404, wherein the dielectric layer 402 may be disposed on the semiconductor layer 404.

Figure 4B:
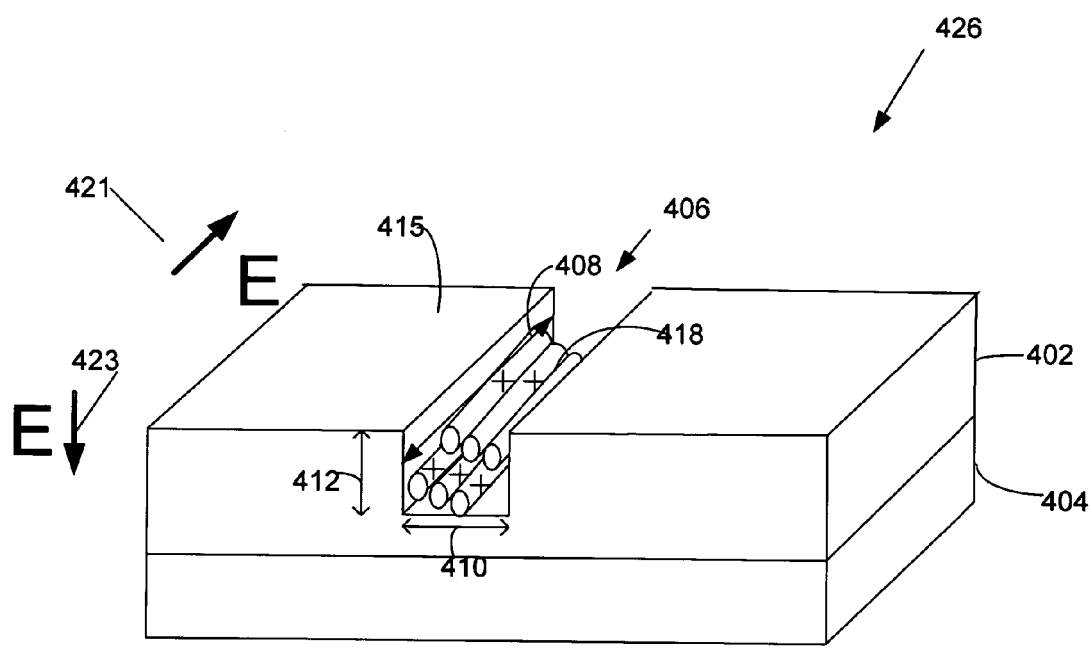

The substrate 400 may comprise at least one opening 406, that may comprise a length 408, a width 410 a depth 412, and a top surface 415. In one embodiment, the at least one opening 406 may comprise at least one sidewall 413 and a bottom surface 411. A nanotube slurry 414 may be applied to the substrate 400, wherein the nanotube slurry 414 may comprise at least one nanotube 418. The at least one nanotube 418 may posses a nanotube charge state 420, that may be positive or negative, in some embodiments. A first electric field 421 may be applied in a direction substantially parallel to the length 408 of the at least one opening 406 (FIG. 4b). A second electric field 423 may be applied in a direction substantially perpendicular to the top surface 415 of the substrate 400.

The magnitudes of the first electric field 421 and the second electric field 423 may depend on the particular application. In one embodiment, the magnitude of the first electric field 421 may be chosen so that the at least one nanotube 418 may be aligned substantially parallel to the length 408 of the at least one opening 406. In one embodiment, the magnitude of the second electric field 423 may be chosen so that the at least one nanotube 418 may be pulled, and/or drawn substantially into the at least one opening 406 (FIG. 4b).

Because the at least one nanotube 418 may comprise a length 420 that may be longer than the width 410 of the at least one opening 406, the at least one nanotube 418 may be oriented substantially parallel with the length 408 of the at least one opening 406. In one embodiment, portions of different ones of the at least one nanotube 418 may overlap each other. In another embodiment, the at least one nanotube 418 may also be placed side to side with a different one of the at least one nanotube 418.

Thus, by configuring and optimizing the geometries of the at least one nanotube 418 and the at least one opening 406, a nanotube interconnect structure 426 may be formed. Overlapping portions of the at least one nanotube 418 may greatly reduce the contact resistance of the nanotube interconnect structure 426.

Figure 5A:
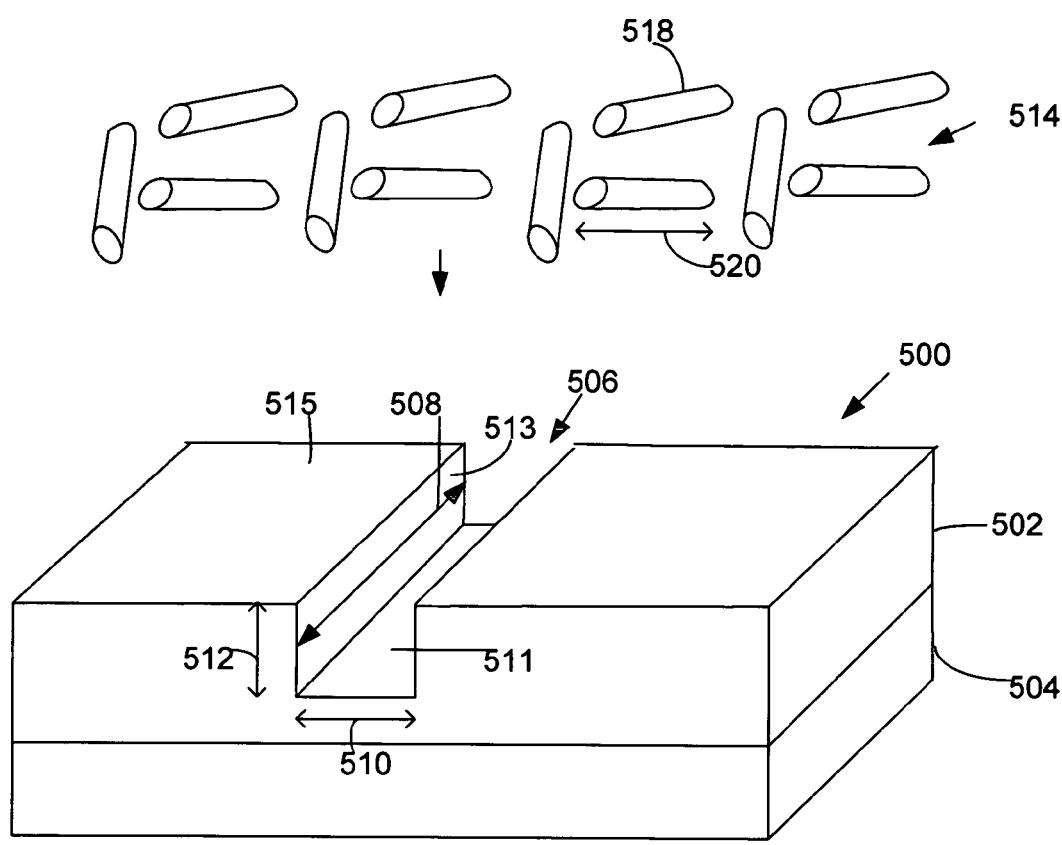
FIG. 5a-5c represent methods of forming structures according to an embodiment of the present invention.

In another embodiment, a substrate 500 may be provided, similar to the substrate 100 of FIG. 1a, for example (FIG. 5a). In one embodiment, the substrate 500 may comprise a dielectric layer 502 that may comprise an interlayer dielectric (ILD) 502, for example. In one embodiment, the substrate 500 may further comprise a semiconductor layer 504, wherein the dielectric layer 502 may be disposed on the semiconductor layer 504.

The substrate 500 may comprise at least one opening 506, that may comprise a length 508, a width 510 a depth 512, and a top surface 515. In one embodiment, the at least one opening 506 may comprise at least one sidewall 513 and a bottom surface 511. A nanotube slurry 514 may be applied to the substrate 500, wherein the nanotube slurry 514 may comprise a plurality of nanotubes 518.

Figure 5B:
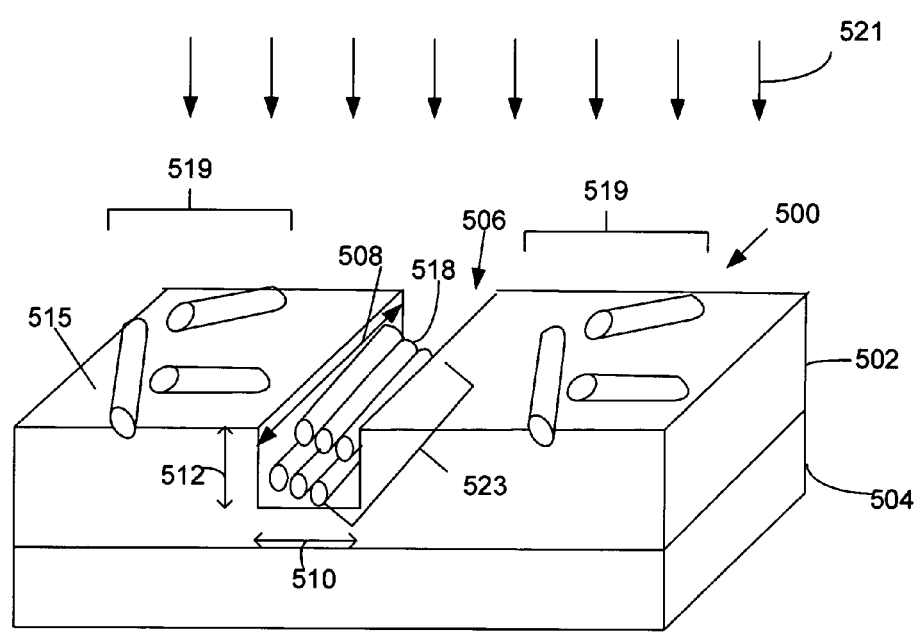

A first portion 519 of the plurality of nanotubes 518 may be substantially placed on the top surface 515 of the substrate 500, and a second portion 523 of the plurality of nanotubes 518 may substantially placed within the at least one opening 506 (FIG. 5b). The second portion 523 of the plurality of nanotubes 518 may be substantially placed into the at least one opening 506 utilizing any of the embodiments of the present invention previously described herein, and/or combinations thereof, or they may be placed within the at least one opening 506 utilizing other methods not described herein.

Figure 5C:
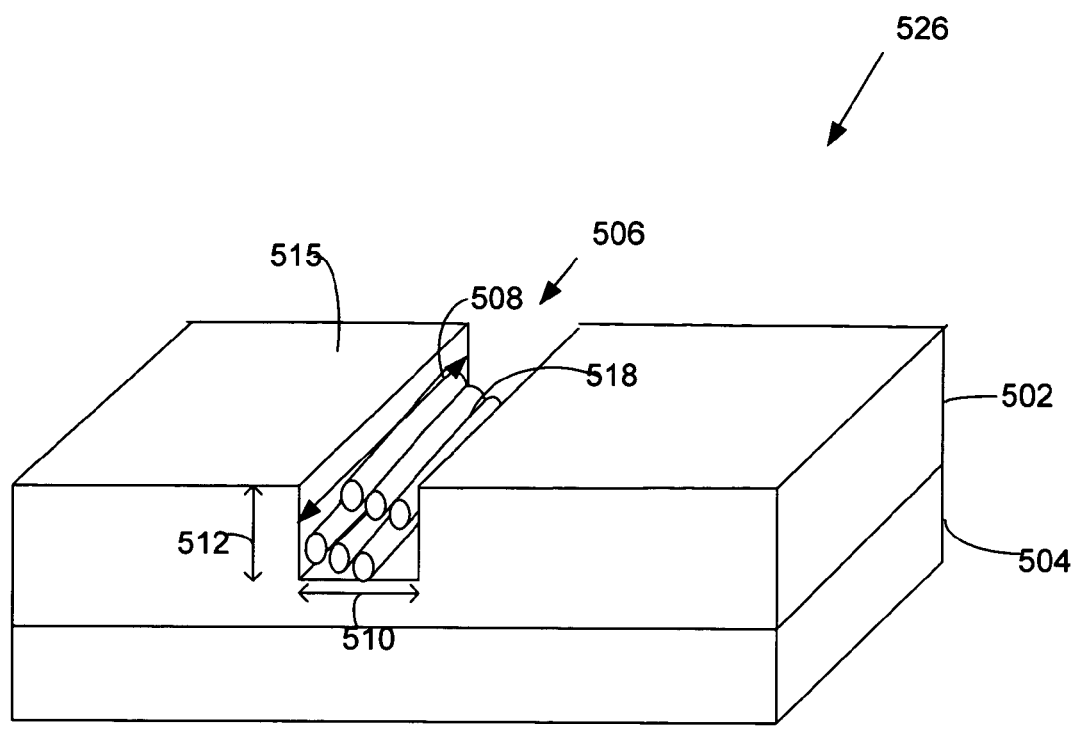

A fluid 521 may be applied to the substrate 500. The fluid 521 may comprise any such fluid, such as but not limited to a water rinse, for example, that may comprise a force such that the fluid 521 may substantially remove the first portion 519 of the plurality of nanotubes 518 from the top surface 515 of the substrate 500 (FIG. 5c). The force of the fluid 521 applied may be chosen (depending upon the particular application) such that the second portion 523 of the plurality of nanotubes 518 may substantially remain within the at least one opening 506. It will be understood by those skilled in the art that the second portion 523 of the plurality of nanotubes may be bonded to the at least one sidewall 513 and/or a bottom surface 511 of the at least one opening 506 by van der Waal forces, for example, in some embodiments.

Figure 6A:
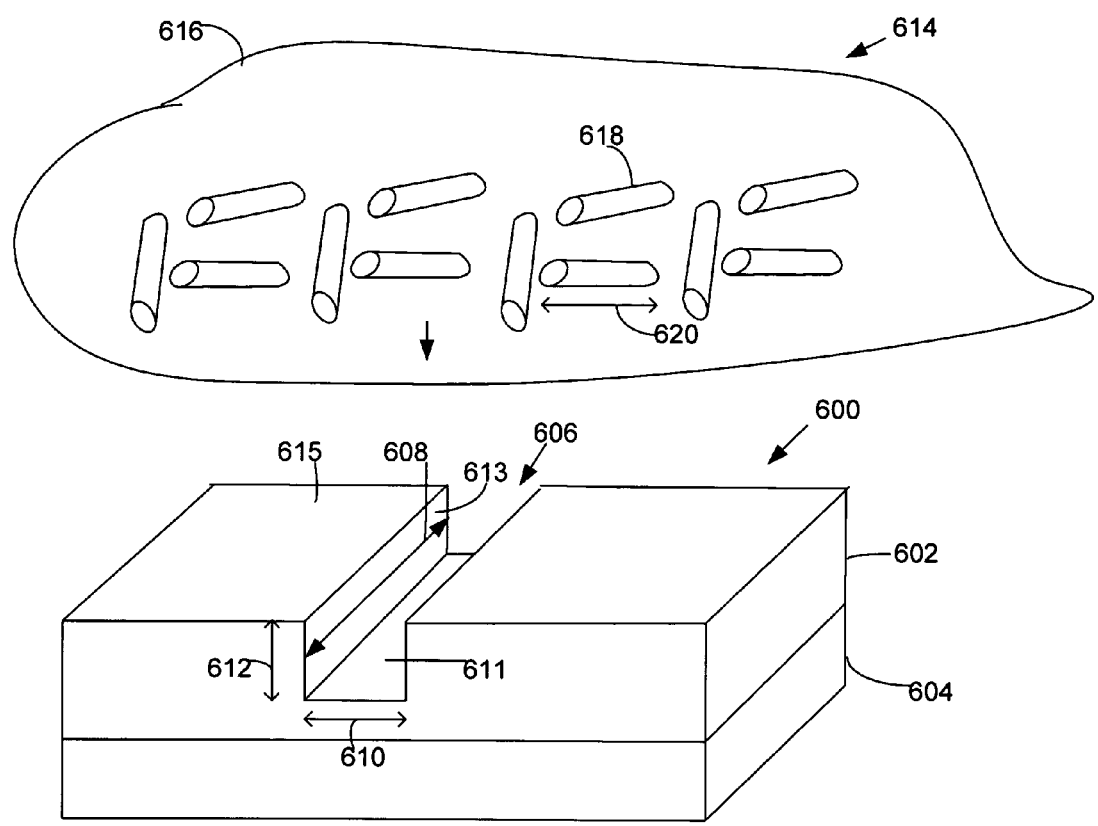
FIG. 6a-6c represent methods of forming structures according to an embodiment of the present invention.

In another embodiment, a substrate 600 may be provided, similar to the substrate 100 of FIG. 1a, for example (FIG. 6a). In one embodiment, the substrate 600 may comprise a dielectric layer 602 that may comprise an interlayer dielectric (ILD) 602, for example. In one embodiment, the substrate 600 may further comprise a semiconductor layer 604, wherein the dielectric layer 602 may be disposed on the semiconductor layer 604.

The substrate 600 may comprise at least one opening 606, that may comprise a length 608, a width 610, a depth 612, and a top surface 615. In one embodiment, the at least one opening 606 may comprise at least one sidewall 613 and a bottom surface 611. A nanotube slurry 614 may be applied to the substrate 600, wherein the nanotube slurry 614 may comprise a liquid portion 616 and at least one nanotube 618.

Figure 6B:
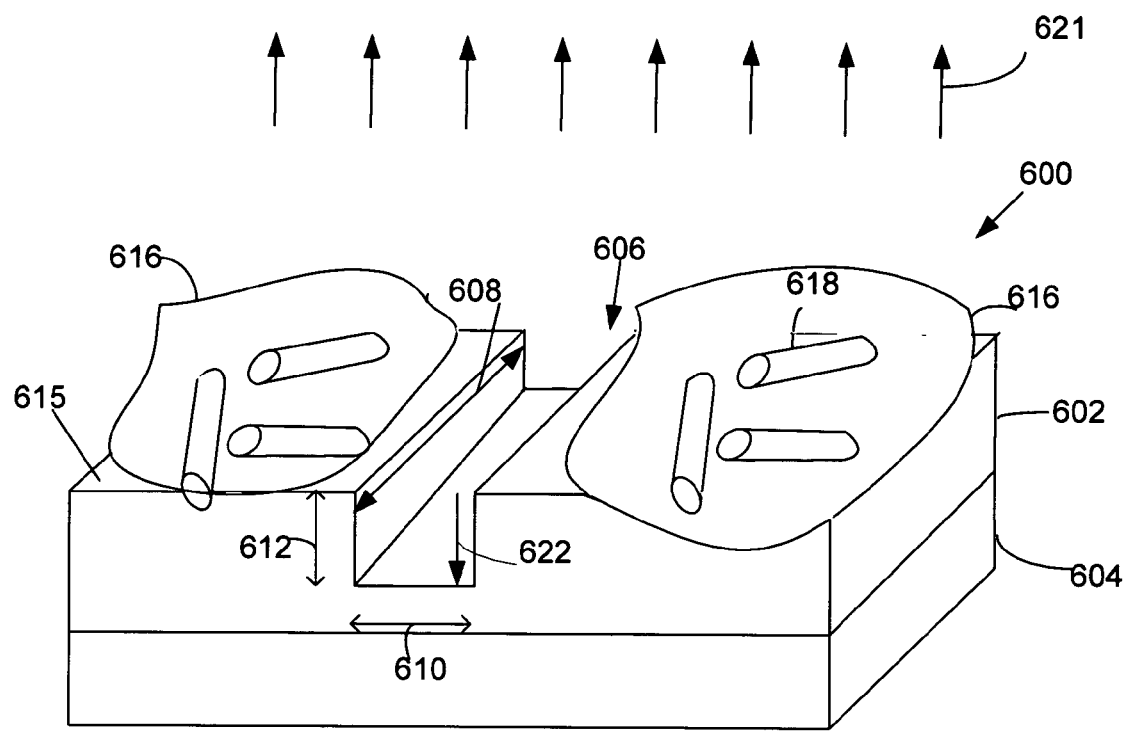
Figure 6C:
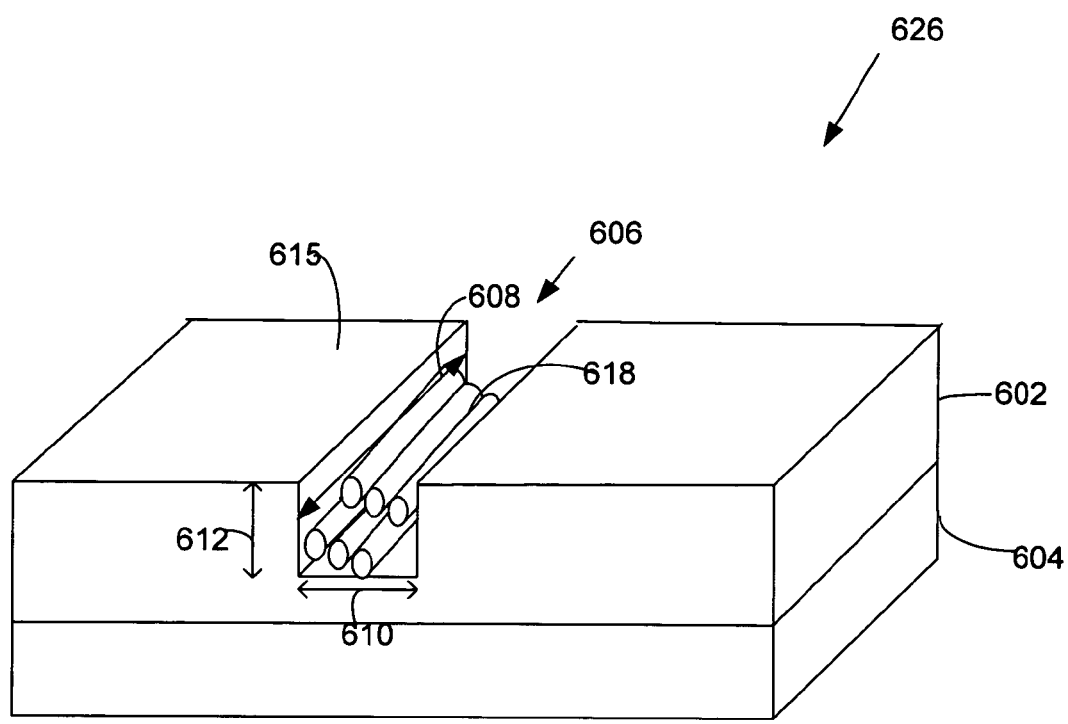

In one embodiment, portions of the nanotube slurry 614 may be disposed on the top surface 615 of the substrate 600 (FIG. 6b). In one embodiment, the at least one nanotube 618 may be substantially placed within the at least one opening 606 by applying heat 621 to the substrate 600. The amount of heat 621 applied to the substrate 600 may vary depending upon the particular application but in general may be of sufficient magnitude to substantially evaporate the liquid portion 616 of the nanotube slurry 614.

The at least one nanotube 618 may be substantially placed into the at least one opening 606 by the downward force 622 of the surface tension that may develop as the liquid portion 616 of the nanotube slurry 614 may be evaporated from the substrate 600. The downward force 622 of the surface tension that may develop may pull the at least one nanotube 618 into the at least one opening, and it will be further understood by those skilled in the art that the at least one nanotube 618 may be further bonded to the at least one sidewall 613 and/or a bottom surface 611 of the at least one opening 606 by van der Waal forces, for example, in some embodiments. Additionally, nanotubes that may be residually remaining on the top surface 615 may be removed utilizing methods well known to those skilled in the art.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as nanotube interconnect structures, are well known in the art. Therefore, the Figures provided herein illustrate only portions of an exemplary microelectronic structure that pertains to the practice of the present invention. Thus the present invention is not limited to the structures described herein.

What is claimed is:

1. A method of forming a structure comprising:
providing a substrate comprising at least one opening; and
applying a nanotube slurry comprising at least one nanotube to the substrate by utilizing a mechanical process, wherein the at least one nanotube is substantially placed within the at least one opening, and wherein a length of the at least one nanotube is oriented substantially parallel with a length of the at least one opening.

2. The method of claim 1 further comprising wherein a ratio of a length of the at least one nanotube to a width of the at least one opening is greater than about 2:1.

3. The method of claim 1 further comprising wherein a ratio of a depth of the at least one opening to a diameter of the at least one nanotube is greater than about 2:1.

4. The method of claim 1 further comprising wherein a portion of an individual nanotube is placed above and on a portion of a different individual nanotube.

5. The method of claim 1 further comprising wherein a side portion of the individual nanotube is placed in contact with a side portion of the different individual nanotube.

6. The method of claim 1 further comprising wherein the mechanical process comprises a CMP process.

7. A method comprising:
providing a substrate comprising at least one opening and a top surface, wherein the top surface comprises a first charge state, and a bottom surface and a sidewall of the at least one opening comprises a second charge state, wherein the first charge state and the second charge state are opposite in sign; and
applying a nanotube slurry comprising at least one nanotube to the substrate, wherein the at least one nanotube comprises the first charge state, and wherein the at least one nanotube is substantially placed within the at least one opening by electrostatic attraction.

8. The method of claim 7 wherein the at least one nanotube is substantially placed within the at least one opening by electrostatic attraction comprises wherein a nanotube charge of the at least one nanotube is electrostatically attracted to the second charge of the sidewall and bottom surface of the at least one opening.

9. The method of claim 7 further comprises wherein the top surface comprises a positive charge state, and wherein the bottom surface and the at least one sidewall of the at least one opening comprise a negative charge state.

10. The method of claim 9 further comprising wherein the at least one nanotube comprises a positive nanotube charge state.

11. The method of claim 7 further comprising wherein the top surface comprises a mask comprising the first charge state.

12. The method of claim 11 further comprising wherein the mask comprises at least one of aluminum oxide, tantalum, tantalum nitride, cobalt, nickel, copper, lanthanum, lanthanum oxide and combinations thereof.

13. The method of claim 7 further comprising wherein the top surface comprises a surfactant, wherein the surfactant comprises the first charge state.

14. The method of claim 7 further comprising wherein the at least one nanotube comprises a functional unit comprising the first charge state.

15. The method of claim 7 further comprising wherein a length of the at least one nanotube is oriented substantially parallel with a length of the at least one opening.

16. The method of claim 7 further comprising wherein a length of the at least one nanotube is substantially longer than a width of the at least one opening.

* * * * *

UNITED STATES PATENT AND TRADEMARK OFFICE
CERTIFICATE OF CORRECTION

PATENT NO. : 7,666,465 B2
APPLICATION NO. : 11/026320
DATED : February 23, 2010
INVENTOR(S) : Fischer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 418 days.

Signed and Sealed this

Twenty-eighth Day of December, 2010

David J. Kappos
*Director of the United States Patent and Trademark Office*